(12) United States Patent
Cho et al.

(10) Patent No.: US 9,048,459 B2
(45) Date of Patent: Jun. 2, 2015

(54) DISPLAY DEVICE AND METHOD OF MANUFACTURING THE SAME

(71) Applicant: Samsung Display Co., LTD., Yongin, Gyeonggi-Do (KR)

(72) Inventors: Sang Hwan Cho, Suwon-si (KR); Jin Hwan Jeon, Suwon-si (KR); Soo Youn Kim, Siheung-si (KR); Sang Hyun Park, Hwaseong-si (KR); Yoon Hyeung Cho, Yongin-si (KR); Seung Yong Song, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/020,004

(22) Filed: Sep. 6, 2013

(65) Prior Publication Data
US 2014/0117330 A1    May 1, 2014

(30) Foreign Application Priority Data
Oct. 26, 2012 (KR) .................... 10-2012-0119852

(51) Int. Cl.
*H01L 51/00* (2006.01)
*H01L 51/56* (2006.01)
*H01L 51/52* (2006.01)

(52) U.S. Cl.
CPC ............ *H01L 51/56* (2013.01); *H01L 51/5256* (2013.01); *H01L 51/5281* (2013.01)

(58) Field of Classification Search
CPC .. H01L 51/5281; H01L 51/5256; H01L 51/56
USPC ............................................ 257/40; 438/29
See application file for complete search history.

(56) References Cited

U.S. PATENT DOCUMENTS

| | | | |
|---|---|---|---|
| 5,049,780 A | 9/1991 | Dobrowolski et al. | |
| 6,146,225 A | 11/2000 | Sheats et al. | |
| 6,411,019 B1 | 6/2002 | Hofstra et al. | |
| 6,545,409 B2 | 4/2003 | Kahen | |
| 6,570,325 B2 | 5/2003 | Graff et al. | |
| 2008/0285255 A1* | 11/2008 | Bourdelais et al. | 362/19 |
| 2010/0067235 A1* | 3/2010 | Yamashita et al. | 362/293 |
| 2010/0079869 A1* | 4/2010 | Inoue et al. | 359/586 |
| 2012/0028009 A1* | 2/2012 | Gerardin et al. | 428/212 |
| 2012/0280612 A1 | 11/2012 | Lee et al. | |

FOREIGN PATENT DOCUMENTS

| | | |
|---|---|---|
| KR | 1020100125134 A | 11/2010 |
| KR | 101076262 B1 | 10/2011 |
| KR | 1020120012926 A | 2/2012 |

* cited by examiner

*Primary Examiner* — Tu-Tu Ho
(74) *Attorney, Agent, or Firm* — Robert E. Bushnell, Esq.

(57) ABSTRACT

A display device and a method of manufacturing the same. The display device includes a substrate, an organic light emitting diode (OLED) arranged on the substrate, a thin film encapsulation layer arranged on the substrate to cover the OLED and including an inorganic material layer and an organic material layer, and an anti-reflection layer arranged on the thin film encapsulation layer and including a dielectric layer and a metal layer.

24 Claims, 11 Drawing Sheets

DISPLAY DEVICE AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Oct. 26, 2012 and there duly assigned Serial No. 10-2012-0119852.

BACKGROUND OF THE INVENTION

1. Field of the Invention

The present invention relates to a display device and a method of manufacturing the same.

2. Description of the Related Art

Presently, along with advances in display technology, portable display devices such as notebook computers, mobile phones or portable media players (PMPs) as well as home display devices such as TV sets or monitors have proliferated in the marketplace. With the trend toward the lighter and slimmer displays, liquid crystal display devices and organic electroluminescent diode (OLED) display devices, and so on, are drawing much attention.

Among the devices, the OLED display device is a self-emissive display device using an organic material and has various advantages, including low power consumption and high brightness. In general, an organic material used in an OLED may experience a sharp reduction in lifespan when it is exposed to external factors such as oxygen or moisture. Therefore, packaging technology for protecting organic materials from external factors is essential and required. In this regard, packaging technology for protecting organic materials using a glass substrate has been proposed. However, due to the thickness and weight of the glass substrate, the overall thickness and weight of the OLED may increase.

The OLED is typically used in a portable system. When an image is viewed outdoors using an OLED, external light is reflected in the OLED, lowering contrast and visibility. To overcome this problem, the reflection of external light may be reduced by arranging a circular polarizer on one surface of the OLED. However, due to the thickness of the circular polarizer, the overall thickness of the OLED is increased.

SUMMARY OF THE INVENTION

The present invention provides a display device and a method of manufacturing the same, which can reduce the overall thickness while improving visibility by reducing reflection of external light.

The present invention provides a display device and a method of manufacturing the same, which is lightweight and slim while having improved durability and reliability by preventing oxygen and moisture from penetrating into an organic light emitting diode (OLED) using a thin film encapsulation layer.

The above and other objects of the present invention will be described in or be apparent from the following description of the preferred embodiments.

According to one aspect of the present invention, there is provided a display device that includes a substrate, an organic light emitting diode (OLED) arranged on the substrate, a thin film encapsulation layer arranged on the substrate to cover the OLED; and an anti-reflection layer arranged on the thin film encapsulation layer and including a dielectric layer and a metal layer. The anti-reflection layer may include a plurality of dielectric layers and a plurality of metal layers, wherein ones of the dielectric layers and ones of the metal layers may be alternately stacked. The dielectric layer may include at least one of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $VO_x$, $SiN_x$, $eN_x$, AlN, ZnS, CdS, SiC, SiCN, MgF, $CaF_2$, NaF, $BaF_2$, $PbF_2$, LiF, $LaF_3$, and GaP. The metal layer may include at least one of Al, Ag, Mg, Cr, Ti, Ni, Au, Ta, Cu, Ca, Co, Fe, Mo, W, Pt, and Yb.

The thin film encapsulation layer may include at least one inorganic material layer. The inorganic material layer may include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride (SiON). The thin film encapsulation layer may also include at least one organic material layer. The thin film encapsulation layer may include a plurality of inorganic material layers and a plurality of organic material layers that are alternately stacked. The organic material layer may include at least one of epoxy resin, acryl resin, perylene resin and polyimide resin.

The display device may also include an interference preventing layer arranged between the thin film encapsulation layer and the anti-reflection layer. The interference preventing layer may include a transparent material. The interference preventing layer may have a thickness in a range of 100 nm to 10 μm. The display device may also include a thin film transistor (TFT) to drive the OLED. The TFT may include an active layer comprised of a material selected from a group consisting of amorphous silicon, polycrystalline silicon and an oxide.

According to another aspect of the present invention, there is provided a method of manufacturing a display device, including forming an organic light emitting diode (OLED) on a substrate, forming a thin film encapsulation layer on the substrate to cover the OLED and forming an anti-reflection layer on the thin film encapsulation layer, the anti-reflection layer including a dielectric layer and a metal layer. The forming of the thin film encapsulation layer may include forming at least one inorganic material layer. The at least one inorganic material layer may include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride (SiON). The forming of the thin film encapsulation layer may include forming a plurality of inorganic material layers and a plurality of organic material layers in an alternate manner. Each of the organic material layers may include at least one of epoxy resin, acryl resin, perylene resin and polyimide resin.

The forming of the anti-reflection layer may include forming a plurality of dielectric layers and a plurality of metal layers stacked alternately. Each of the dielectric layers may include at least one of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $VO_x$, $SiN_x$, $eN_x$, AlN, ZnS, CdS, SiC, SiCN, MgF, $CaF_2$, NaF, $BaF_2$, $PbF_2$, LiF, $LaF_3$, and GaP. Each of the metal layers may include at least one of Al, Ag, Mg, Cr, Ti, Ni, Au, Ta, Cu, Ca, Co, Fe, Mo, W, Pt, and Yb. The display device may also include an interference preventing layer interposed between the thin film encapsulation layer and the anti-reflection layer. The interference preventing layer may include a transparent material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will be understood that when an element or layer is referred to as being "on", another element or layer, it can be directly on the other element or layer or intervening elements or layers may be present. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present invention will be described with reference to the accompanying drawings.

Embodiments of the present invention will be hereinafter described with reference to the accompanying drawings. In the following description, the display device according to the present invention will be described with regard to an OLED by way of example, the invention will also be applied to all kinds of display devices, including white OLEDs, which are currently developed and commercially available or can be realized in the future according to the technological development.

Figure 1:
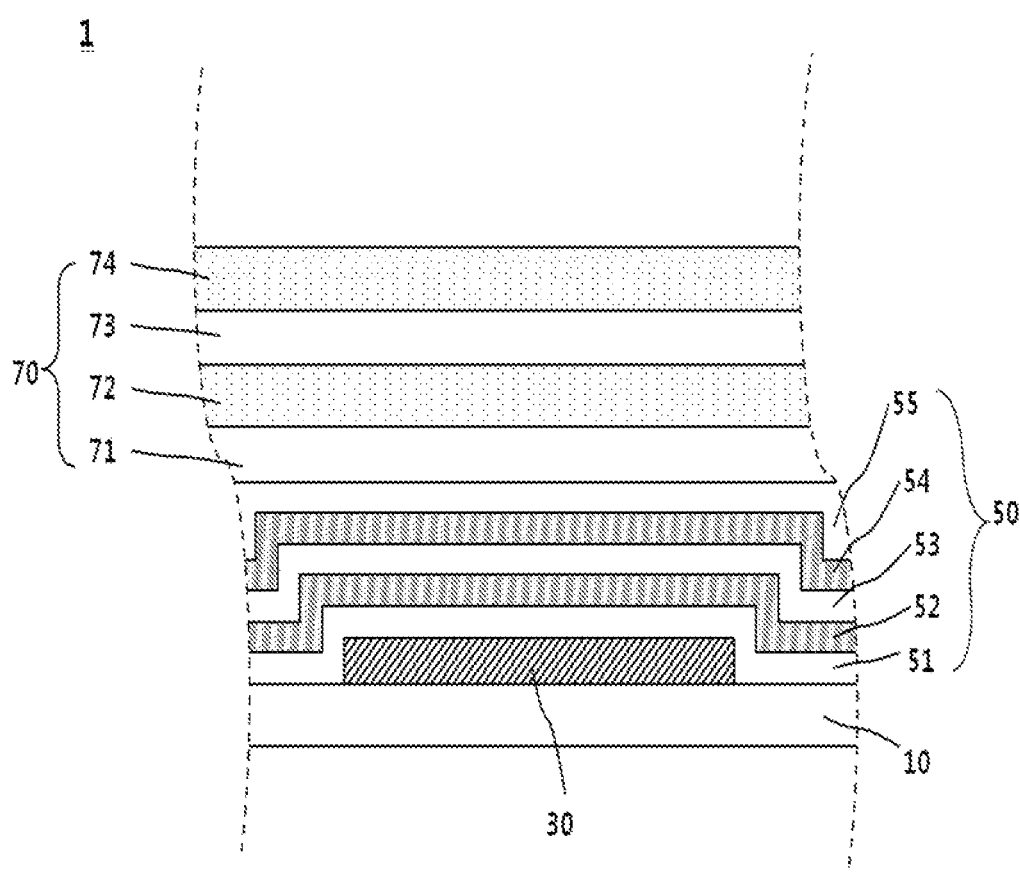
FIG. 1 is a cross-sectional view of a display device according to an embodiment of the present invention.

FIG. 1 is a cross-sectional view of a display device according to an embodiment of the present invention.

Referring to FIG. 1, the display device 1 according to an embodiment of the present invention includes a substrate 10, an OLED 30 formed on the substrate 10, a thin film encapsulation layer 50 formed on the substrate 10 and covering the OLED 30, and an anti-reflection layer 70 formed on the thin film encapsulation layer 50.

The substrate 10 may include an insulating substrate. The insulating substrate may be made out of a transparent glass material containing transparent $SiO_2$ as a main component. In addition, the insulating substrate may include substrates made of a variety of materials, such as a plastic material. Further, the insulating substrate may be a flexible substrate.

The OLED 30 may be formed on the substrate 10. The OLED 30 may include a first electrode (not shown) formed on the substrate 10, an organic emission layer (not shown) formed on the first electrode, and a second electrode (not shown) formed on the organic emission layer.

The first electrode may be formed on the substrate 10 by evaporation or sputtering, and may be a cathode or an anode. The first electrode may include a transparent electrode, a semi-transparent electrode or a reflective electrode, and may be made out of indium tin oxide (ITO), indium zinc oxide (IZO), tin oxide ($SnO_2$), zinc oxide (ZnO), Al, Ag, or Mg, but aspects of the present invention are not limited thereto. In addition, the first electrode may be formed to have various types of stacks, including a stack of two or more layers using two or more different materials.

An organic emission layer may be formed on the first electrode. The organic emission layer may include known light-emitting materials. For example, the organic emission layer may include a known host including Alq3, 4,4'-N,N'-dicarbazol-biphenyl (CBP), poly(n-vinylcarbazole) (PVK), or distrylarylene (DSA) and phosphorescent organic metal complex (PtOEP), and known dopants including a red dopant such as Ir(piq)3, Btp2Ir (acac), or 4-(dicyanomethylene)-2-t-butyl-6-(1,1,7,7-tetramethyljulolidyl-9-enyl)-4Hpyran (DCJTB), a green dopant such as Ir(ppy)3 (ppy=phenylpyridine), Ir(ppy)2(acac), or Ir(mpyp)3, and a blue dopant such as F2Irpic, (F2ppy)2Ir(tmd), Ir(dfppz)3, or ter-fluorine. However, the aforementioned exemplar materials of the organic emission layer are provided only for illustration, but all possible light-emitting materials that are currently developed or commercially available or can be realized in the future according to technological development.

The second electrode may be formed on the organic emission layer by evaporation or sputtering, and may be a cathode or an anode. The second electrode may include a metal having a low work function, an alloy, an electrically conductive compound and mixtures thereof. For example, the second electrode may include Li, Mg, Al, Al—Li, Ca, Mg—In, Mg—Ag and so on, but aspects of the present invention are not limited thereto. In addition, the second electrode may be formed to have various types of stacks, including a stack of two or more layers using two or more different materials.

In addition to the organic emission layer, at least one selected from the group consisting of a hole injection layer, a hole transport layer, a hole blocking layer, an electron transport layer, and an electron injection layer may further be formed between the first electrode and the second electrode. The hole injection layer, the hole transport layer, the hole blocking layer, the electron transport layer, and the electron injection layer may be formed by known methods using known materials.

Known hole injecting materials may be used as materials of the hole injection layer. Examples of the hole injecting materials may include, but not limited to, a phthalocyanine compound such as copper phthalocyanine, m-MTDATA [4,4',4"-tris(3-methylphenylphenylamino)triphenylamine], NPB (N,N'-di(1-naphthyl)-N,N-diphenylbenzidine), TDATA, 2-TNATA, PANI/DBSA (polyaniline/dodecylbenzenesulfonic acid), PEDOT/PSS (poly(3,4-ethylenedioxythiophene)/Poly(4-styrene sulfonate), PANI/CSA (polyaniline/camphor sulfonic acid) or PANI/PSS (polyaniline)/poly(4-styrene sulfonate).

Examples of the hole transport layer may include a carbazole derivative, such as N-phenylcarbazole or polyvinyl carbazole, and a general amine derivative having an aromatic condensed ring, such as 4,4'-bis[N-(1-naththyl)-N-phenylamino]biphenyl (NPB), N,N'-bis(3-methylphenyl)-N,N-diphenyl-[1,1-biphenyl]-4,4'-diamine (TPD), or N,N'-di(naththalene-1-yl)-N,N'-diphenyl benzidine (α-NPD).

In addition, the hole blocking layer may be formed using, for example, an oxadiazole derivative, a triazole derivative, or a phenanthroline derivative.

Meanwhile, the electron transport layer may be formed using, for example, quinoline derivative, specifically tris(8-quinolinorate) aluminum (Alq3), or TAZ (3-(4-biphenylyl)-4-phenyl-5-(4-tert-butylphenyl)-1,2,4-triazole). The electron injection layer may be formed using, for example, LiF, NaCl, CsF, Li$_2$O, or BaO, but not limited thereto.

The thin film encapsulation layer 50 covering the OLED 30 may be formed on the substrate 10. The thin film encapsulation layer 50 may prevent oxygen or moisture from penetrating into the OLED 30. The thin film encapsulation layer 50 may have non-limiting types of structures. For example, the thin film encapsulation layer 50 may be configured such that an inorganic material layer and an organic material layer are alternately arranged. That is to say, as shown in FIG. 1, a first inorganic material layer 51, a first organic material layer 52, a second inorganic material layer 53, a second organic material layer 54, and a third inorganic material layer 55 may be sequentially stacked on the substrate 10 and the OLED 30, but aspects of the present invention are not limited thereto. Alternatively, the thin film encapsulation layer 50 may also have stacked structures of various combinations of layers formed on the OLED 30, including a stack of organic material layer/inorganic material layer/organic material layer sequentially stacked in that order, a stack of inorganic material layer/inorganic material layer/organic material layer sequentially stacked in that order, and so on. In addition, although not shown, one of various layers constituting the thin film encapsulation layer 50 may be a metal layer. While FIG. 1 shows that the thin film encapsulation layer 50 has a stack of five layers, which is, however, provided only for illustration, the thin film encapsulation layer 50 may have a stack of four layers, a stack of six layers, and various other types of stacks.

The respective inorganic material layers 51, 53 and 55 may prevent external moisture and oxygen from penetrating into the OLED 30, and the respective organic material layers 52 and 54 may alleviate internal stress of the inorganic material layers 51, 53 and 55 or may fill small cracks or pinholes of the inorganic material layers 51, 53 and 55.

The inorganic material layer may be formed by non-limiting methods using non-limiting materials.

For example, the inorganic material layer may include a first inorganic material layer 51, a second inorganic material layer 53 and a third inorganic material layer 55, which are made of a transparent material, respectively, and examples thereof may include, but not limited to, silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and combinations thereof.

The first inorganic material layer 51, the second inorganic material layer 53 and the third inorganic material layer 55 may be formed by a vacuum film formation method, such as sputtering, chemical vapor deposition (CVD), e-beam, thermal evaporation, or thermal ion beam assisted deposition (IBAD). Examples of the CVD may include ICP-CVD (Induced Coupled Plasma-Chemical Vapor Deposition), CCP (Capacitively Coupled Plasma)-CVD, SWP (Surface Wave Plasma)-CVD and so on, which is, however, provided only for illustration, and all possible methods that are currently developed and commercially available or can be realized in the future according to the technological development may be employed in forming the inorganic material layer according to the present invention.

As described above, the thin film encapsulation layer 50 may further include an organic material layer alternately disposed with an inorganic material layer, and the organic material layer may be formed by non-limiting methods using non-limiting materials.

For example, each of the first organic material layer 52 and the second organic material layer 54 may be made of a transparent material, and examples thereof may include, but not limited to, epoxy resin, acryl resin, perylene resin, polyimide resin and combinations thereof.

The first organic material layer 52 and the second organic material layer 54 may be deposited by spin coating, spray coating, screen printing, ink-jetting, dispensing, and so on, but not limited thereto. In addition, all possible methods that are currently developed and commercially available or can be realized in the future according to the technological development may be employed in forming the organic material layer according to the present invention, and examples thereof may include sputtering, chemical vapor deposition (CVD), plasma enhanced chemical vapor deposition (PECVD), thermal evaporation, thermal ion beam assisted deposition (IBAD), and atomic layer deposition (ALD).

In the display device 1 according to the present invention, the thin film encapsulation layer 50 is formed, thereby effectively preventing external moisture and oxygen from penetrating into the OLED 30. Accordingly, deterioration of the OLED 30 can be prevented, thereby minimizing failure in view of display quality of the display device 1 while improving durability and reliability of the display device 1. In addition, the thin film encapsulation layer 50 is formed using the inorganic material layer and the organic material layer, thereby reducing the overall thickness and weight of the display device 1, compared to a case of forming an encapsulation portion using a glass substrate.

The anti-reflection layer 70 for preventing reflection of external light may be formed on the thin film encapsulation layer 50, and may include a dielectric layer and a metal layer.

The anti-reflection layer 70 may have a multi-layered structure, but not limited thereto. For example, as shown in FIG. 1, the anti-reflection layer 70 may be formed on the thin film encapsulation layer 50 such that a first metal layer 71, a first dielectric layer 72, a second metal layer 73, and a second dielectric layer 74 are alternately stacked one on top of the other, but not limited thereto. That is to say, a dielectric layer may first be stacked on the thin film encapsulation layer 50. Alternatively, two or more stacks of the metal layer or the dielectric layer may be successively formed. In addition, while FIG. 1 shows that the anti-reflection layer 70 has a four-layered structure, which is, however, provided only for illustration, the anti-reflection layer 70 may have a five-layer structure, a six-layer structure, and various types of stacks. The anti-reflection layer 70 may have non-limiting types of structures.

For example, each of the first metal layer 71 and the second metal layer 73 of the anti-reflection layer 70 may include, but not limited to, one metal or an alloy of two or more metals selected from the group consisting of Al, Ag, Mg, Cr, Ti, Ni, Au, Ta, Cu, Ca, Co, Fe, Mo, W, Pt, and Yb.

The first metal layer 71 and the second metal layer 73 may be formed by sputtering, chemical vapor deposition (CVD), physical vapor deposition (PVD), e-beam, thermal evaporation, or thermal ion beam assisted deposition (IBAD), but not limited thereto.

Since metals absorb light, some of the light transmitted through a metal layer may be absorbed. That is to say, when the anti-reflection layer 50 includes a metal layer, reflection of external light can be reduced by destructive interference using some of the reflected light. In addition, the external light that is not completely cancelled by destructive interference may further be absorbed using light absorption occurring when the light transmits through the metal layer.

As described above, the anti-reflection layer 70 may further include a dielectric layer, which may be alternately stacked with the metal layer. The dielectric layer may be formed by non-limiting methods using non-limiting materials.

For example, each of the first dielectric layer 72 and the second dielectric layer 74 may include, but not limited to, one material or a combination of two or more materials selected from the group consisting of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $VO_x$, $SiN_x$, $eN_x$, AlN, ZnS, CdS, SiC, SiCN, MgF, $CaF_2$, NaF, $BaF_2$, $PbF_2$, LiF, $LaF_3$, and GaP. In addition, at least one of the first dielectric layer 72 and the second dielectric layer 74 may be formed of the same material as the organic material layer or the inorganic material layer of the thin film encapsulation layer 50.

The first dielectric layer 72 and the second dielectric layer 74 may be deposited by spin coating, spray coating, screen printing, ink-jetting, dispensing, and so on, but not limited thereto. In addition, all possible methods that are currently developed and commercially available or can be realized in the future according to the technological development may be employed in forming the dielectric layer according to the present invention, and examples thereof may include sputtering, chemical vapor deposition (CVD), plasma enhanced chemical vapor deposition (PECVD), thermal evaporation, thermal ion beam assisted deposition (IBAD), and atomic layer deposition (ALD).

The dielectric layer in the anti-reflection layer 70 may adjust or compensate for a phase difference of light. That is to say, the dielectric layer cancels reflected external light using optically destructive interference, thereby preventing reflection of external light. Here, the term "optically destructive interference" refers to a phenomenon in which light waves reflected from the interface therebetween are canceled when they have the same reflection amplitude and frequency while having a phase difference of approximately 180 degrees.

That is to say, the anti-reflection layer 70 according to the present invention can reduce reflection of external light by cancelling the externally incident light using optically destructive interference and light absorption by a metal layer. Accordingly, the reflection of external light can be reduced without using a circular polarizer, thereby reducing the overall thickness of the display device 1 while improving visibility of the display device 1 even with the reduced thickness of the display device 1.

Figure 2:
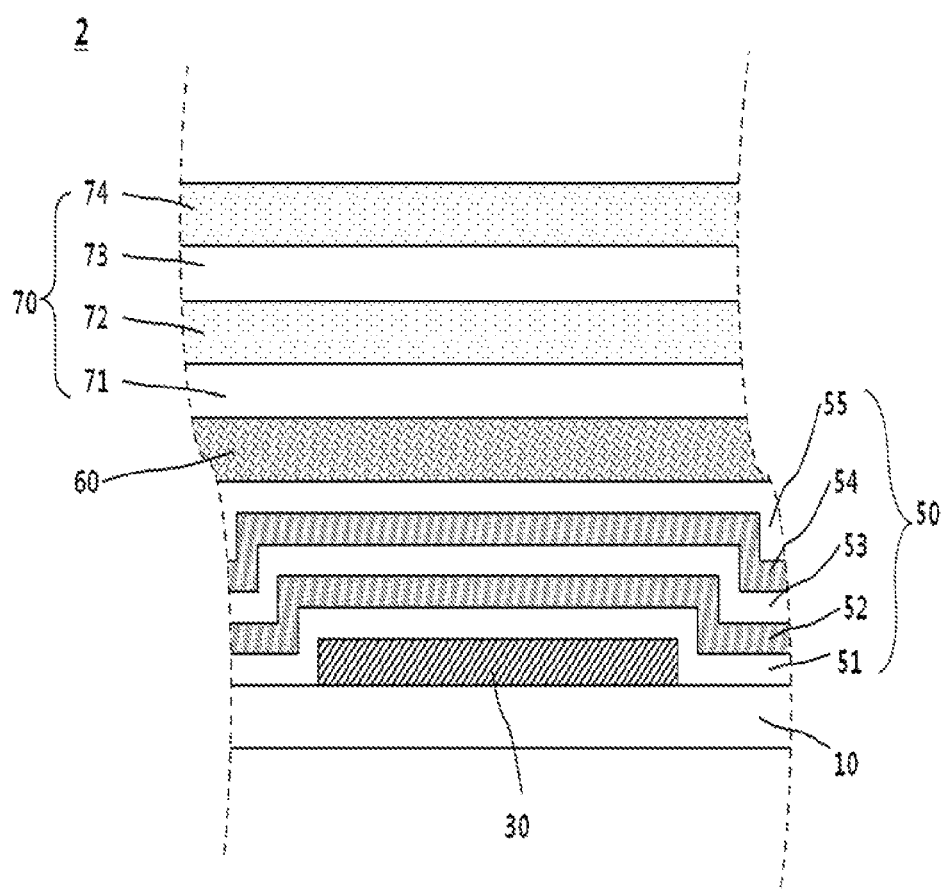
FIG. 2 is a cross-sectional view of a display device according to another embodiment of the present invention.

FIG. 2 is a cross-sectional view of a display device 2 according to another embodiment of the present invention.

Referring to FIGS. 1 and 2, unlike the display device 1 shown in FIG. 1, the display device 2 according to another embodiment of the present invention may further include an interference preventing layer 60 formed between the thin film encapsulation layer 50 and the anti-reflection layer 70.

The interference preventing layer 60 is a kind of buffering layer for preventing light interference due to a difference in the refractive index between the thin film encapsulation layer 50 and the anti-reflection layer 70, and may minimize the light interference by adjusting its thickness or material. The interference preventing layer 60 may be formed using non-limiting materials. For example, the interference preventing layer 60 may be made of a transparent material, including a known organic material or a known inorganic material. For example, a material for forming the organic material layer or the inorganic material layer of the thin film encapsulation layer 50 may also be used in forming the interference preventing layer 60. In addition, a material for forming the dielectric layer of the anti-reflection layer 70 may also be used in forming the interference preventing layer 60. The interference preventing layer 60 may be formed by non-limiting methods. For example, a method for forming the organic material layer or the inorganic material layer of the thin film encapsulation layer 50 may also be used in forming the interference preventing layer 60. The thickness of the interference preventing layer 60 may be appropriately adjusted to be greater than or equal to a light coherent length, for example, in a range of 100 nm to 10 μm, but not limited thereto.

Figure 3:
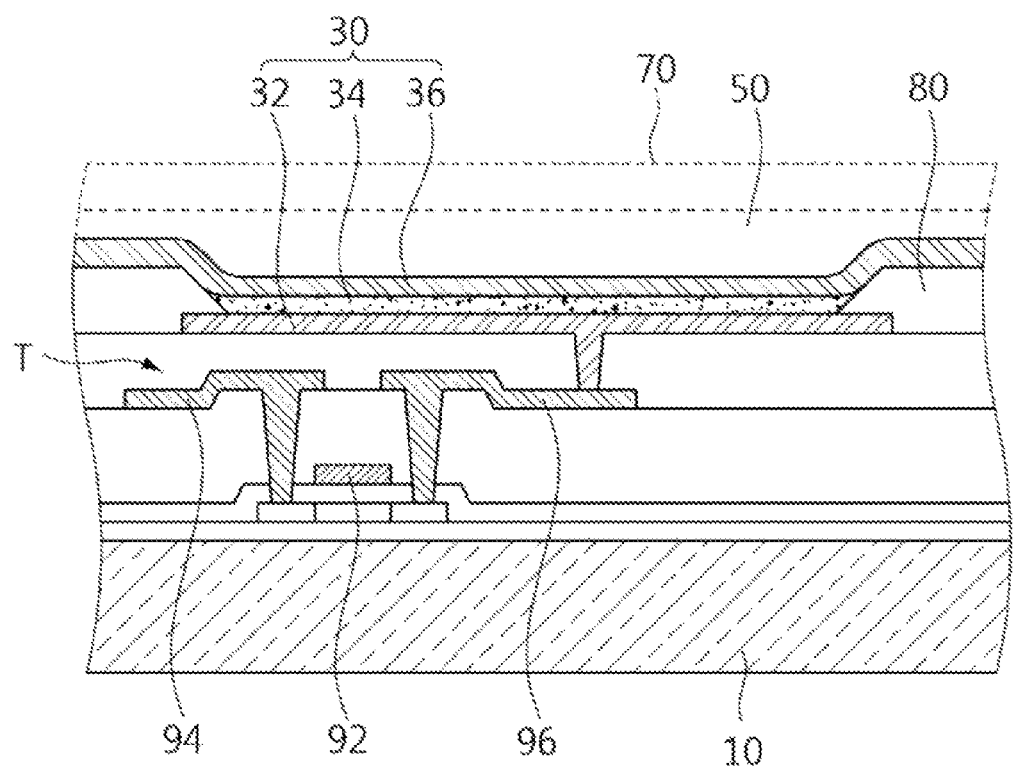
FIG. 3 is a cross-sectional view of a thin film transistor forming portion of a display device according to the present invention.

FIG. 3 is a cross-sectional view of a thin film transistor forming portion of a display device according to the present invention.

Referring to FIGS. 1 to 3, each of the display devices according to the present invention may include a thin film transistor T formed on the substrate 10, an OLED 30, a thin film encapsulation layer 50 and an anti-reflection layer 70. An interference preventing layer (not shown) may further be formed between the thin film encapsulation layer 50 and the anti-reflection layer 70.

The OLED 30 may include a first electrode 32, a second electrode 36 and an organic emission layer 34 formed between the first electrode 32 and the second electrode 34. Although not shown, in addition to the organic emission layer 34, at least one selected from the group consisting of a hole injection layer, a hole transport layer, a hole blocking layer, an electron transport layer, and an electron injection layer may further be formed between the first electrode 32 and the second electrode 36, which are substantially the same as those previously described in conjunction with FIG. 1, and detailed descriptions thereof will be omitted.

A pixel defining film 80 for partitioning pixels may be formed at an exterior portion where the organic emission layer 34 is formed. The pixel defining film 80 may be formed using non-limiting materials, for example, an organic material.

The thin film transistor T may be formed on the substrate 10. The thin film transistor T is a portion for supplying current to the OLED 30 to drive the same. The thin film transistor T may include a gate electrode 92, a source electrode 94 and a drain electrode 96, and the first electrode 32 of the OLED 30 may be connected to the drain electrode 96 of the thin film transistor T.

The thin film transistor T is not limited in view of its type and may include, for example, an amorphous silicon TFT (a-Si TFT), a polycrystalline silicon TFT (poly-Si TFT), and an oxide TFT, but not limited thereto.

The thin film encapsulation layer 50 may be formed on the substrate 10 to cover the OLED 30. Accordingly, the thin film encapsulation layer 50 may effectively prevent moisture or oxygen from penetrating into the OLED 30. The other details of the thin film encapsulation layer 50 are the same as that previously described in conjunction with FIG. 1, and a repeated description will not be given.

The anti-reflection layer 70 may be formed on the thin film encapsulation layer 50. The anti-reflection layer 70 prevents the reflection of external light without using a circular polarizer, thereby reducing the overall thickness of the display device while improving visibility of the display device.

Figure 4:
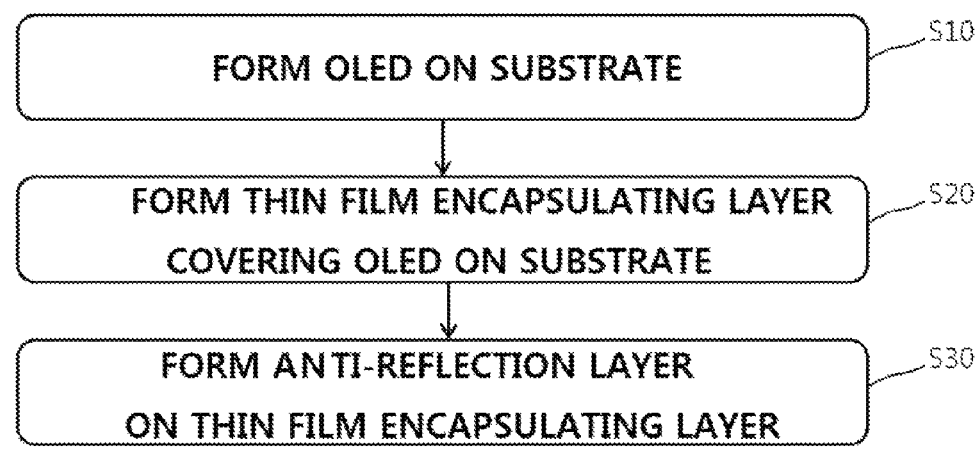
FIG. 4 is a flowchart illustrating a method of manufacturing a display device according to an embodiment of the present invention.
Figure 5:
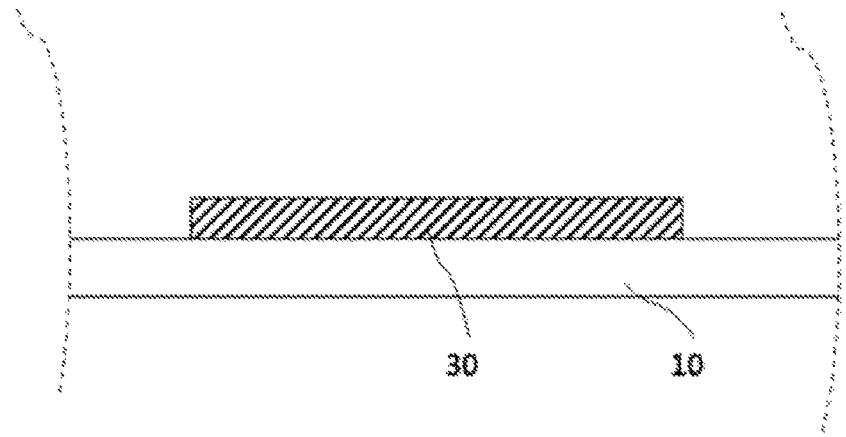
FIGS. 5 to 7 are cross-sectional views illustrating processing steps of the method of manufacturing a display device according to an embodiment of the present invention.
Figure 6:
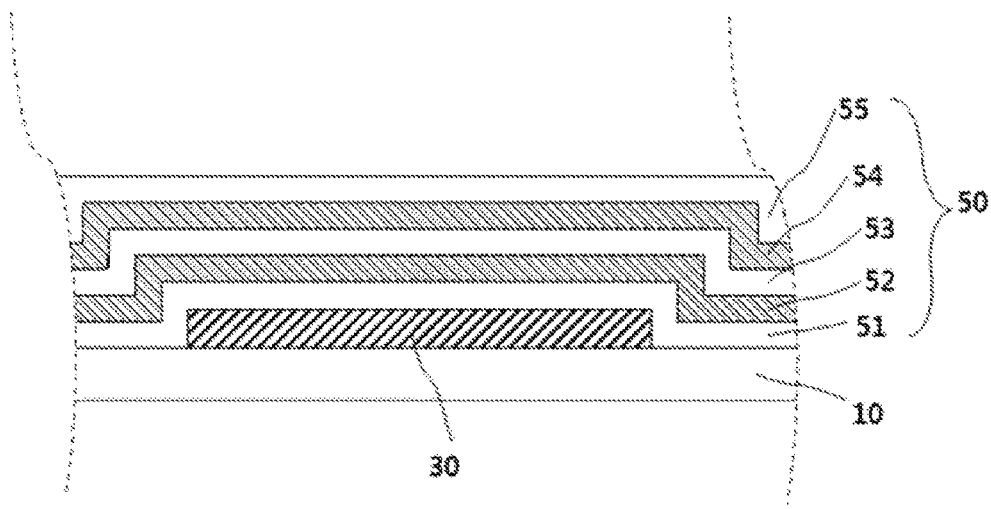
Figure 7:
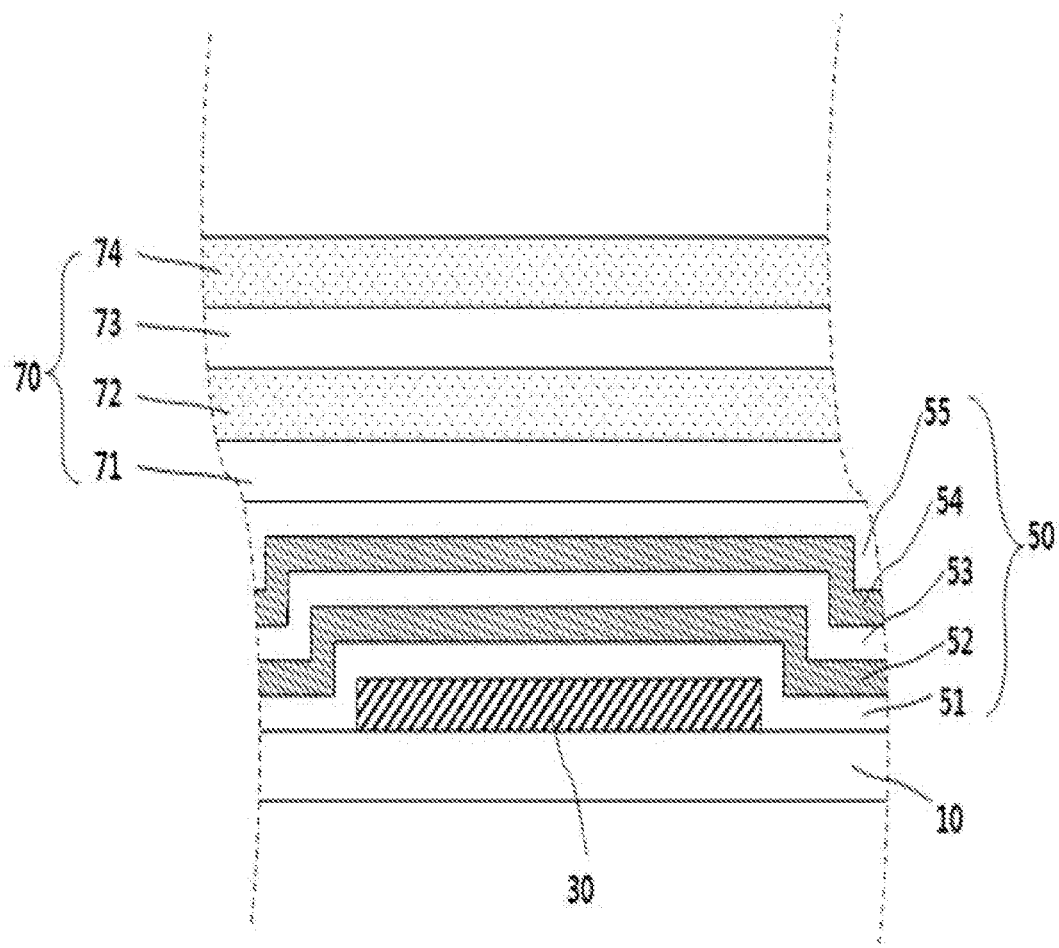

Turning now to FIGS. 4-7, FIG. 4 is a flowchart illustrating a method of manufacturing a display device according to an embodiment of the present invention, and FIGS. 5 to 7 are cross-sectional views illustrating processing steps of the method of manufacturing a display device according to an embodiment of the present invention.

Referring to FIG. 4, the method of manufacturing a display device includes forming an OLED on a substrate (S10), forming a thin film encapsulation layer on the substrate to cover the OLED (S20), and forming an anti-reflection layer including a dielectric layer and a metal layer on the thin film encapsulation layer (S30). In addition, although not shown, the method of manufacturing a display device may further include forming an interference preventing layer on the thin film encapsulation layer between the forming of the thin film encapsulation layer (S20) and the forming of the anti-reflection layer (S30).

The forming of the OLED on the substrate (S10) may be achieved as follows. Referring to FIGS. 1 and 5, a first electrode (#32 in FIG. 3) is first on the substrate 10. The first electrode may be formed on the substrate by evaporation or sputtering, and may be a cathode or an anode. The first electrode may include a transparent electrode, a semi-transparent electrode or a reflective electrode, and may be formed of indium tin oxide (ITO), indium zinc oxide (IZO), tin oxide ($SnO_2$), zinc oxide (ZnO), Al, Ag, or Mg, but aspects of the present invention are not limited thereto. The other details of the first electrode are the same as previously described in conjunction with FIGS. 1 and 3, and a repeated description will not be given.

Thereafter, an organic emission layer (#34 in FIG. 3) is formed on the first electrode. The organic emission layer may include known light-emitting materials and may be formed by non-limiting methods, which is the same as described above with reference to FIGS. 1 and 3.

After forming the organic emission layer, a second electrode (#36 in FIG. 3) is formed on the organic emission layer. The second electrode may be formed on the organic emission layer by evaporation or sputtering, and may be a cathode or an anode. The second electrode may include a metal having a low work function, an alloy, an electrically conductive compound and mixtures thereof. The other details of the second electrode are the same as described in conjunction with FIGS. 1 and 3, and a repeated description will not be given.

The OLED 30 may be formed on the substrate 10 including the first electrode, the organic emission layer and the second electrode by the above-described methods.

Thereafter, the thin film encapsulation layer 50 covering the OLED 30 is formed on the substrate 10 to cover the OLED (S20), which will be achieved as follows.

Referring to FIGS. 1 and 6, the thin film encapsulation layer 50 covering the OLED 30 may be formed on the substrate 10 and on the OLED 30. The thin film encapsulation layer 50 may include a first inorganic material layer 51, a first organic material layer 52, a second inorganic material layer 53, a second organic material layer 54, and a third inorganic material layer 55 sequentially stacked in that order.

Each of the inorganic material layers 51, 53 and 55 may be made of a transparent material and may be formed by a vacuum film formation method, such as sputtering, chemical vapor deposition (CVD), e-beam, thermal evaporation, or thermal ion beam assisted deposition (IBAD), but not limited thereto, which is the same as described above in FIG. 1.

Each of the respective organic material layers 52 and 54 may be made of a transparent material, and examples thereof may include, but not limited to, epoxy resin, acryl resin, perylene resin, polyimide resin and combinations thereof.

The respective organic material layers 52 and 54 may be deposited by spin coating, spray coating, screen printing, ink-jetting, dispensing, and so on, but not limited thereto. In addition, all possible methods that are currently developed and commercially available or can be realized in the future according to the technological development in forming the organic material layer according to the present invention, and examples thereof include sputtering, chemical vapor deposition (CVD), plasma enhanced chemical vapor deposition (PECVD), thermal evaporation, thermal ion beam assisted deposition (IBAD), and atomic layer deposition (ALD), which is the same as described above in FIG. 1.

As an example, in forming the first organic material layer 52, a monomer for forming polyimide is deposited on the first inorganic material layer 51 by a dry method, including thermal evaporation, plasma enhanced chemical vapor deposition (PECVD), or atomic layer deposition (ALD). Then, the resultant product is subjected to annealing, thereby forming the first organic material layer 52 based on polyimide resin. The second organic material layer 54 may be formed by the same method as the first organic material layer 52. When the first organic material layer 52 is formed by a dry process, such as thermal evaporation, the first organic material layer 52 is alternately deposited in line after the first inorganic material layer 51 is deposited. In addition, a thickness of the first organic material layer 52 can be easily adjusted and the dry process is advantageously simpler than a wet process, thereby increasing the productivity. The monomer for forming the polyimide may include one or more acid components selected from the group consisting of PTCDA (perylenetetracarboxylic dianhydride), BPDA (biphenyltetracarboxylic dianhydride) and PMDA (pyromellitic dianhydride) and one or more amines selected from the group consisting of DADD (diaminododecane), ODA (oxydianiline) and PDA (phenylene diamine), which are, however, provided only for illustration, and non-limiting monomers capable of forming known polyimide based resin can be used in forming the polyimide.

The acid component or the amine component may be deposited on the first inorganic material layer 51 by thermal evaporation, PECVD, or ALD, and then polymerized into a polyimide based resin by annealing.

Meanwhile, although not shown, the thin film encapsulation layer 50 may have various structures, which is the same as described above in FIG. 1.

Thereafter, the anti-reflection layer 70 may be formed on the thin film encapsulation layer 50 (S30), which may be achieved as follows.

Referring to FIGS. 1 and 7, the anti-reflection layer 70 formed on the thin film encapsulation layer 50 may include a first metal layer 71, a first dielectric layer 72, a second metal layer 73, and a second dielectric layer 74 are sequentially stacked in that order.

The first metal layer 71 and the second metal layer 73 may be formed by non-limiting methods using non-limiting materials.

For example, each of the first metal layer 71 and the second metal layer 73 may include, but not limited to, one metal or an alloy of two or more metals selected from the group consisting of Al, Ag, Mg, Cr, Ti, Ni, Au, Ta, Cu, Ca, Co, Fe, Mo, W, Pt, and Yb.

In addition, the first metal layer 71 and the second metal layer 73 may be formed by sputtering, chemical vapor deposition (CVD), physical vapor deposition (PVD), e-beam, thermal evaporation, or thermal ion beam assisted deposition (IBAD), but not limited thereto. The other details of the anti-reflection layer 70 are the same as described in FIG. 1 and a repeated description will not be given.

The first dielectric layer 72 and the second dielectric layer 74 may also be formed by non-limiting methods using non-limiting materials.

For example, each of the first dielectric layer 72 and the second dielectric layer 74 may include, but not limited to, one material or a combination of two or more materials selected from the group consisting of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $VO_x$, $SiN_x$, $eN_x$, AlN, ZnS, CdS, SiC, SiCN, MgF, $CaF_2$, NaF, $BaF_2$, $PbF_2$, LiF, $LaF_3$, and GaP. In addition, at least one of the first dielectric layer 72 and the second dielectric layer 74 may be formed of the same material as the organic material layer or the inorganic material layer of the thin film encapsulation layer 50. The first and second dielectric layers 72 and 74 may be formed by all possible methods that are currently developed and commercially available or can be realized in the future according to the technological development in forming the dielectric layer according to the present invention, and examples thereof include sputtering, chemical vapor deposition (CVD), plasma enhanced chemical vapor deposition (PECVD), thermal evaporation, thermal ion beam assisted deposition (IBAD), and atomic layer deposition (ALD), which is the same as described above in conjunction with FIG. 1.

Meanwhile, although not shown, after forming the thin film encapsulation layer 50 and before forming the anti-reflection layer 70, an interference preventing layer may further be formed on the thin film encapsulation layer 50. The interference preventing layer may be made of a transparent material by non-limiting methods. The thickness of the interference preventing layer may be appropriately adjusted to be greater than or equal to a light coherent length, for example, in a range of 100 nm to 10 μm, but not limited thereto. The other details of the interference preventing layer are the same as described in FIG. 1 and a repeated description will not be given.

Hereinafter, specific examples will be provided for a better understanding of aspects of the present invention. However, the examples are only provided to help understanding of, and not to limit, the present invention.

Comparative Example

An OLED (30 of FIG. 1) was formed on a glass substrate (10 of FIG. 1). The OLED 30 was encapsulated using an encapsulating glass substrate, instead of a thin film encapsulation layer (50 of FIG. 1). A circular polarizer plate was attached onto the encapsulating glass substrate. The encapsulating glass substrate had a thickness of approximately 500 um, and the circular polarizer plate had a thickness of approximately 150 um.

Example 1

An OLED (30 of FIG. 1) was formed on a glass substrate (10 of FIG. 1). A thin film encapsulation layer (50 of FIG. 1) was formed, the thin film encapsulation layer 50 having a stack of five layers including an inorganic material layer ($Al_2O_3$), an organic material layer (acryl), an inorganic material layer ($Al_2O_3$), an organic material layer (acryl) and an inorganic material layer ($Al_2O_3$), and the thin film encapsulation layer (50 of FIG. 1) was formed to have a total thickness of 6 um. An anti-reflection layer (70 of FIG. 1) was formed to have a stack of layers including a metal layer (Cr, 7 nm), a dielectric layer ($SiO_2$, 50 nm), a metal layer (Cr, 7 nm) and a dielectric layer ($SiO_2$, 70 nm).

Figure 8:
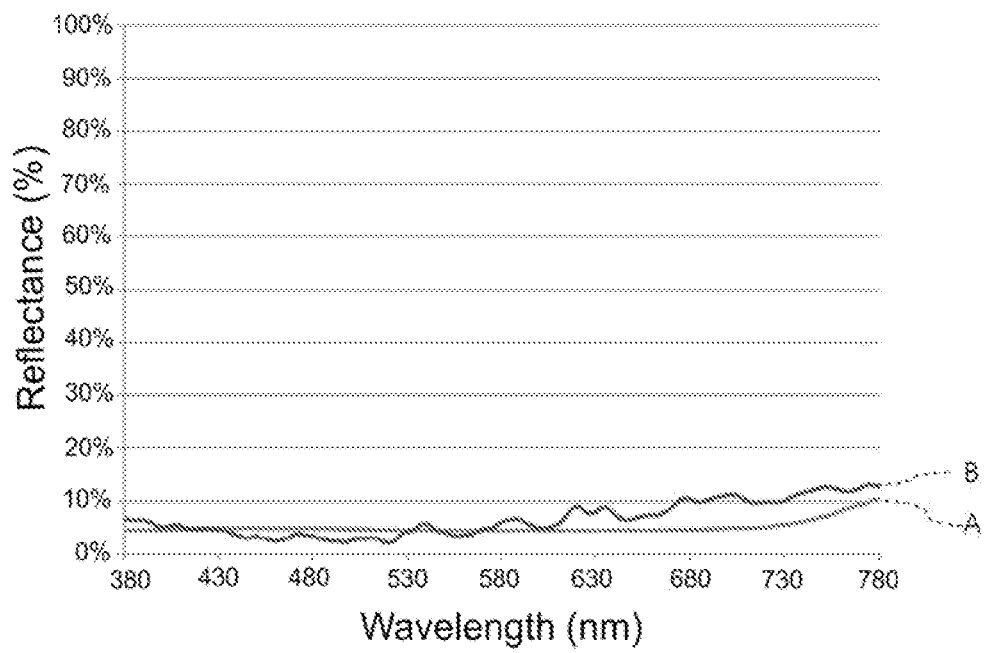
FIG. 8 is a graph illustrating luminous reflectance in Example 1 of the present invention and Comparative Example.
Figure 9:
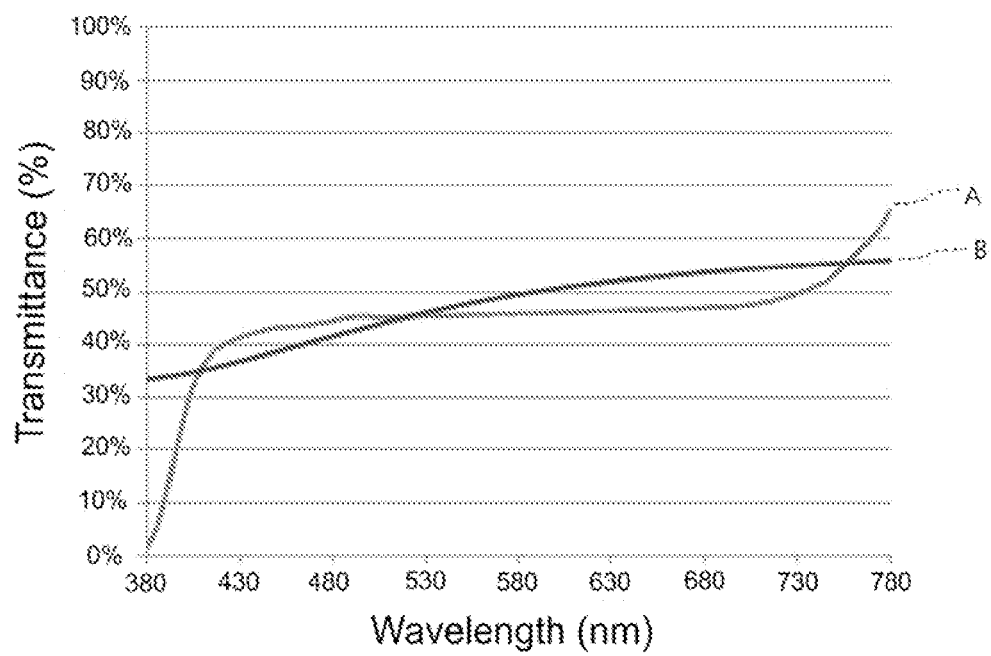
FIG. 9 is a graph illustrating transmittance in Example 1 of the present invention and Comparative Example.

FIG. 8 is a graph illustrating luminous reflectance in Example 1 of the present invention and Comparative Example and FIG. 9 is a graph illustrating transmittance in Example 1 of the present invention and Comparative Example.

Referring to FIG. 8, luminous reflectance in Example 1 (B) was substantially the same as luminous reflectance in Comparative Example (A) throughout the entire optical wavelength area. In detail, the luminous reflectance in Comparative Example (A) was 4.6%, and the luminous reflectance in Example 1 (B) was 4.7%, suggesting that luminous reflectance levels in Comparative Example (A) and Example 1 (B) are substantially equal to each other. In addition, referring to FIG. 9, transmittance in Example 1 (B) and transmittance in Comparative Example (A) were substantially equal to each other.

Example 2

An OLED (30 of FIG. 1) was formed on a glass substrate (10 of FIG. 1). A thin film encapsulation layer (50 of FIG. 1) was formed, the thin film encapsulation layer 50 having a stack of five layers including an inorganic material layer ($Al_2O_3$), an organic material layer (acryl), an inorganic material layer ($Al_2O_3$), an organic material layer (acryl) and an inorganic material layer ($Al_2O_3$). An anti-reflection layer (70 of FIG. 1) was formed to have a stack of layers including a metal layer (Ti, 4 nm), a dielectric layer ($SiO_2$, 50 nm), a metal layer (Ti, 3 nm) and a dielectric layer ($SiO_2$, 70 nm).

Figure 10:
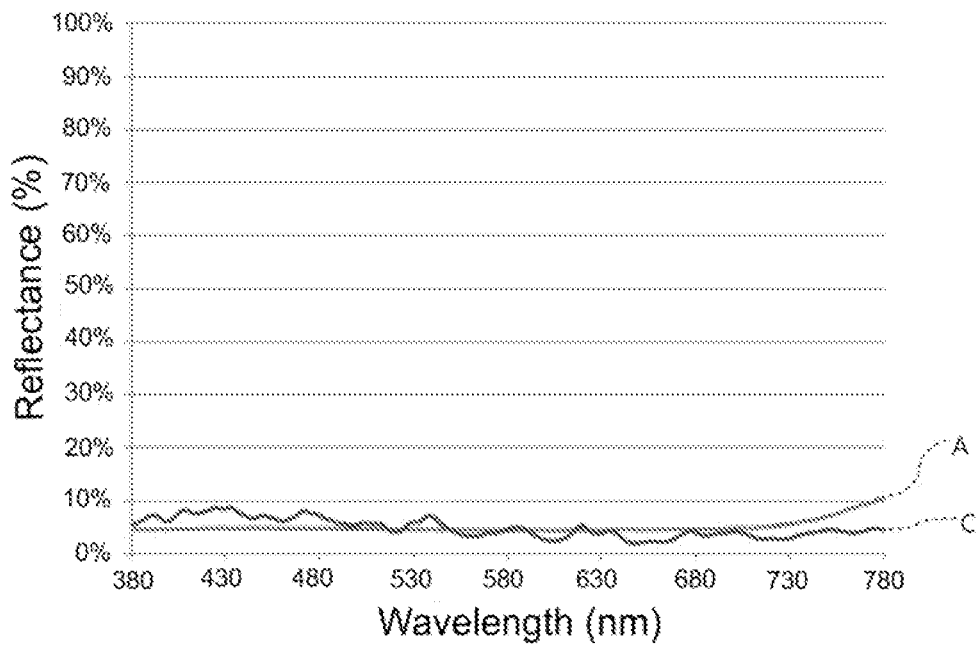
FIG. 10 is a graph illustrating luminous reflectance in Example 2 of the present invention and Comparative Example.
Figure 11:
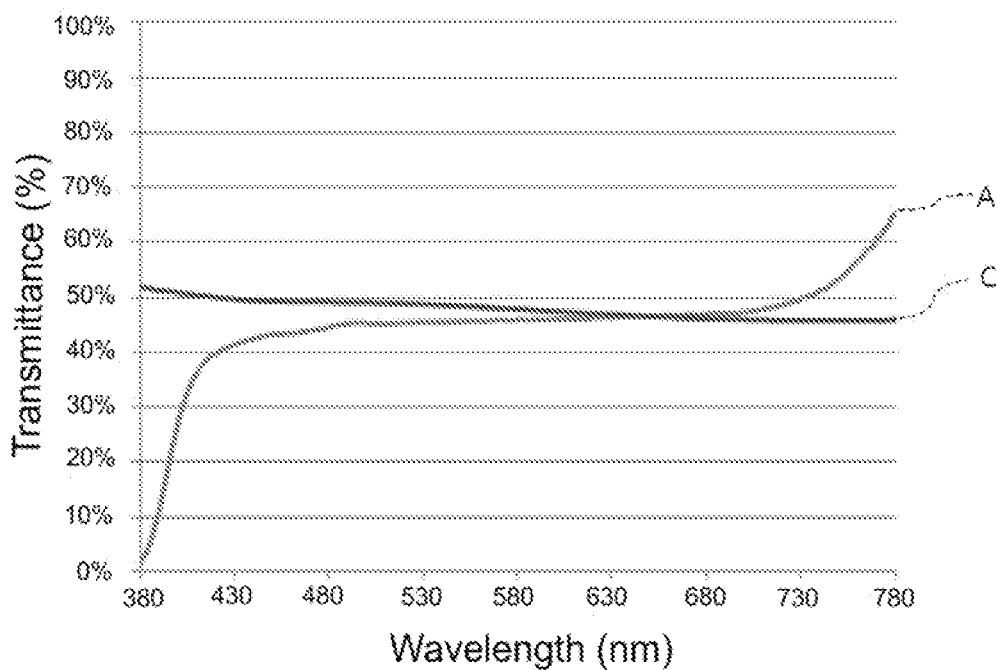
FIG. 11 is a graph illustrating transmittance in Example 2 of the present invention and Comparative Example.

FIG. 10 is a graph illustrating luminous reflectance in Example 2 of the present invention and Comparative Example and FIG. 11 is a graph illustrating transmittance in Example 2 of the present invention and Comparative Example.

Referring to FIG. 10, luminous reflectance in Example 2 (C) was substantially the same as luminous reflectance in Comparative Example (A) throughout the entire optical wavelength area. In detail, the luminous reflectance in Comparative Example (A) was 4.6%, and the luminous reflectance in Example 2 (C) was 4.7%, suggesting that luminous reflectance levels in Comparative Example (A) and Example 2 (C) are substantially equal to each other. In addition, referring to FIG. 11, transmittance in Example 2 (B) and transmittance in Comparative Example (A) were substantially equal to each other.

Example 3

An OLED (30 of FIG. 1) was formed on a glass substrate (10 of FIG. 1). A thin film encapsulation layer (50 of FIG. 1) was formed, the thin film encapsulation layer 50 having a stack of five layers including an inorganic material layer ($SiN_x$), an inorganic material layer (SiCN), an inorganic material layer ($Al_2O_3$), an organic material layer (acryl) and an inorganic material layer ($Al_2O_3$). In addition, an interference preventing layer (60 of FIG. 1) was added, and a 1 um thick acryl layer was used as the interference preventing layer (60 of FIG. 1). An anti-reflection layer (70 of FIG. 1) was formed to have a stack of layers including a metal layer (Ag, 7 nm), a dielectric layer ($SiO_2$, 30 nm), a metal layer (Cr, 5 nm) and a dielectric layer ($SiO_2$, 50 nm).

Figure 12:
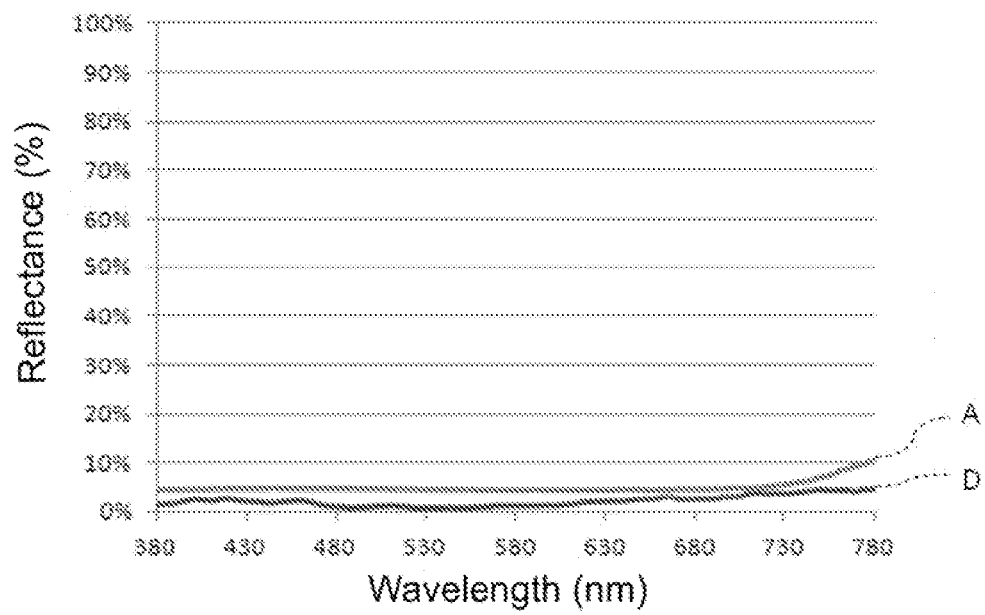
FIG. 12 is a graph illustrating luminous reflectance in Example 3 of the present invention and Comparative Example.
Figure 13:
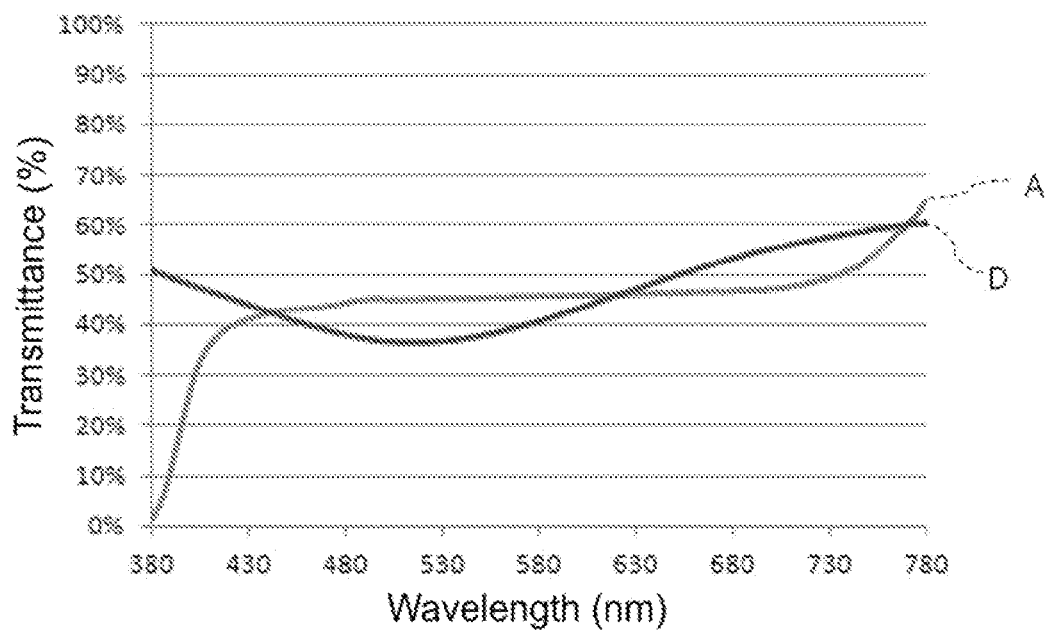
FIG. 13 is a graph illustrating transmittance in Example 3 of the present invention and Comparative Example.

FIG. 12 is a graph illustrating luminous reflectance in Example 3 of the present invention and Comparative Example and FIG. 13 is a graph illustrating transmittance in Example 3 of the present invention and Comparative Example.

Referring to FIG. 12, luminous reflectance in Example 3 (D) was substantially the same as luminous reflectance in Comparative Example (A) throughout the entire optical wavelength area. In detail, the luminous reflectance in Comparative Example (A) was 4.6%, and the luminous reflectance in Example 3 (D) was 1.1%, which is higher than the luminous reflectance in Comparative Example (A). In addition, referring to FIG. 11, transmittance in Example 3 (D) and transmittance in Comparative Example (A) were substantially equal to each other.

Example 4

An OLED (30 of FIG. 1) was formed on a glass substrate (10 of FIG. 1). A thin film encapsulation layer (50 of FIG. 1) was formed, the thin film encapsulation layer 50 having a stack of five layers including an inorganic material layer ($Al_2O_3$), an organic material layer (acryl), an inorganic material layer ($Al_2O_3$), an organic material layer (acryl) and an inorganic material layer ($Al_2O_3$). An anti-reflection layer (70 of FIG. 1) was formed to have a stack of layers including a metal layer (Cr, 7 nm), a dielectric layer ($SiO_2$, 30 nm), a metal layer (Cr, 6 nm, a dielectric layer ($SiO_2$, 40 nm), a metal layer (Cr, 4 nm) and a dielectric layer ($SiO_2$, 70 nm).

Figure 14:
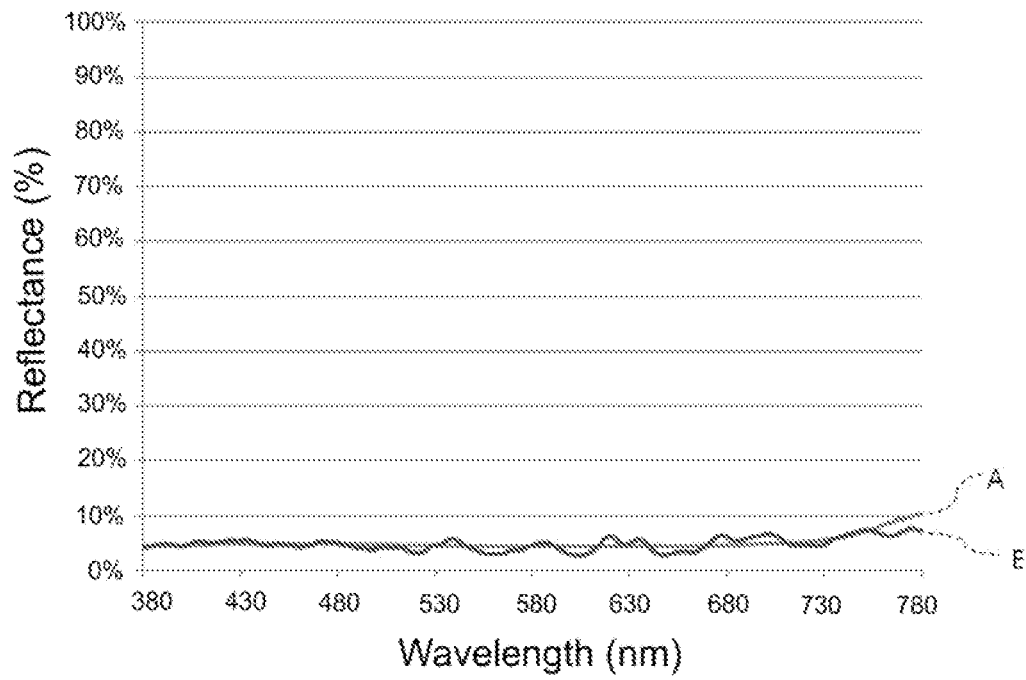
FIG. 14 is a graph illustrating luminous reflectance in Example 4 of the present invention and Comparative Example.
Figure 15:
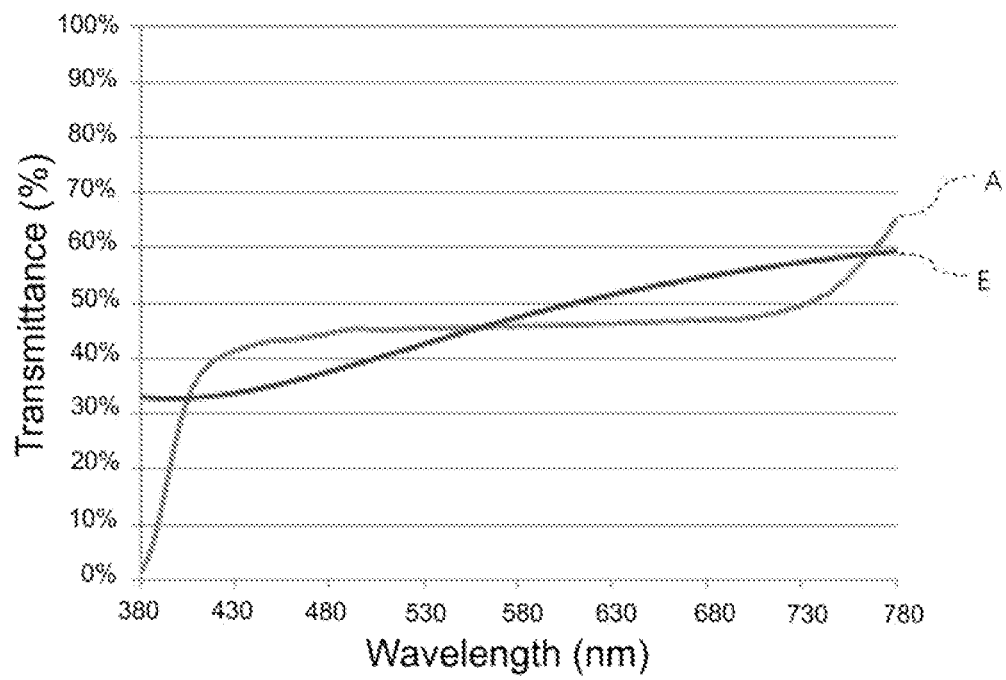
FIG. 15 is a graph illustrating transmittance in Example 4 of the present invention and Comparative Example.

FIG. 14 is a graph illustrating luminous reflectance in Example 4 of the present invention and Comparative Example and FIG. 15 is a graph illustrating transmittance in Example 4 of the present invention and Comparative Example.

Referring to FIG. 14, luminous reflectance in Example 4 (E) was substantially the same as luminous reflectance in Comparative Example (A) throughout the entire optical wavelength area. In detail, the luminous reflectance in Comparative Example (A) was 4.6%, and the luminous reflectance in Example 4 (E) was 4.1%, suggesting that luminous reflectance levels in Comparative Example (A) and Example 4 (E) are substantially equal to each other. In addition, referring to FIG. 15, transmittance in Example 4 (B) and transmittance in Comparative Example (A) were substantially equal to each other.

Example 5

An OLED (30 of FIG. 1) was formed on a glass substrate (10 of FIG. 1). A thin film encapsulation layer (50 of FIG. 1) was formed, the thin film encapsulation layer 50 having a stack of five layers including an inorganic material layer ($Al_2O_3$), an organic material layer (acryl), and inorganic material layer ($Al_2O_3$), an organic material layer (acryl) and an inorganic material layer ($Al_2O_3$). An anti-reflection layer (70 of FIG. 1) was formed to have a stack of layers including a dielectric layer ($SiO_2$, 50 nm), a dielectric layer ($TiO_2$, 30 nm), a metal layer (Ag, 10 nm), a dielectric layer ($SiO_2$, 30 nm), a metal layer (Cr, 9 nm) and a dielectric layer ($SiO_2$, 50 nm).

Figure 16:
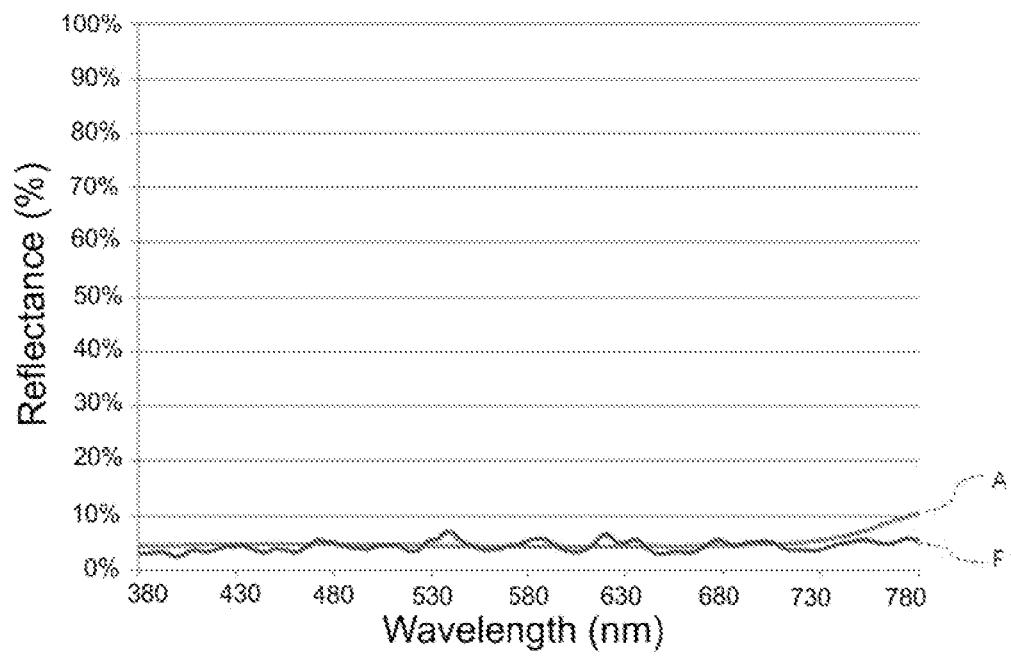
FIG. 16 is a graph illustrating luminous reflectance in Example 5 of the present invention and Comparative Example.
Figure 17:
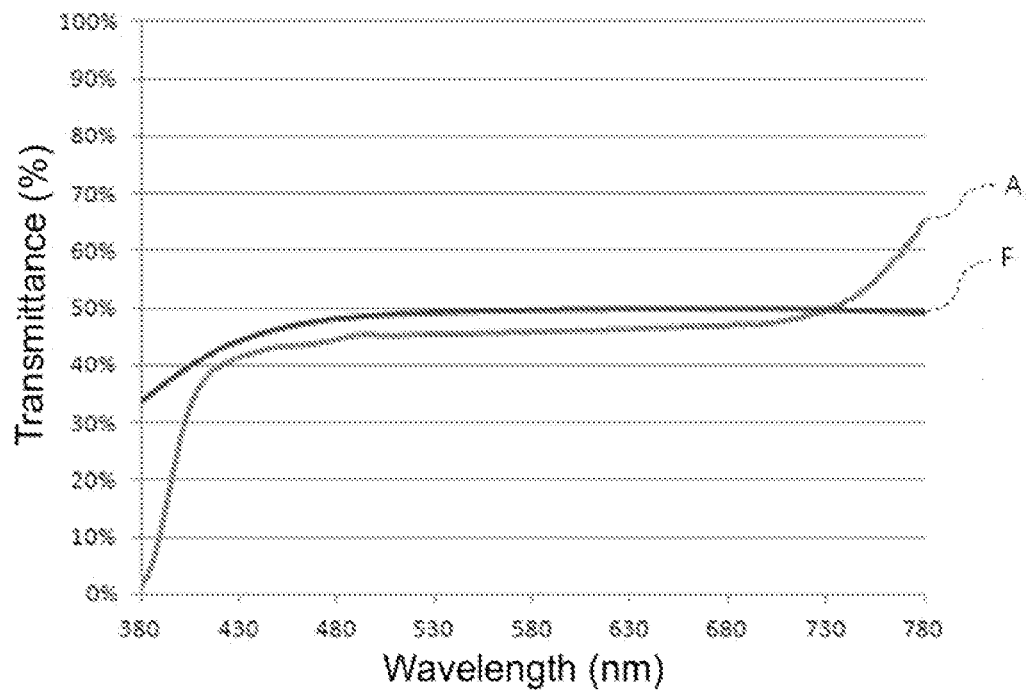
FIG. 17 is a graph illustrating transmittance in Example 5 of the present invention and Comparative Example.

FIG. 16 is a graph illustrating luminous reflectance in Example 5 of the present invention and Comparative Example, and FIG. 17 is a graph illustrating transmittance in Example 5 of the present invention and Comparative Example.

Referring to FIG. 16, luminous reflectance in Example 5 (F) was substantially the same as luminous reflectance in Comparative Example (A) throughout the entire optical wavelength area. In detail, the luminous reflectance in Comparative Example (A) was 4.6%, and the luminous reflectance in Example 5 (F) was 4.7%, suggesting that luminous reflectance levels in Comparative Example (A) and Example 5 (F) are substantially equal to each other. In addition, referring to FIG. 17, transmittance in Example 5 (F) and transmittance in Comparative Example (A) were substantially equal to each other.

That is to say, as described above, the display device according to the present invention can prevent reflection of external light without a separate circular polarizer, thereby attaining a lightweight and slim display device.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A display device, comprising:
   a substrate;
   an organic light emitting diode (OLED) arranged on the substrate;
   a thin film encapsulation layer arranged on the substrate to cover the OLED; and
   an anti-reflection layer arranged on the thin film encapsulation layer and including at least one dielectric layer and at least one metal layer,
   wherein the at least one dielectric layer and the at least one metal layer are alternately stacked.

2. The display device of claim 1, wherein the anti-reflection layer comprises at least two dielectric layers and at least two metal layers, wherein ones of the dielectric layers and ones of the metal layers are alternately stacked.

3. The display device of claim 1, wherein the at least one dielectric layer includes at least one material selected from a group consisting of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $VO_x$, $SiN_x$, $eN_x$, AlN, ZnS, CdS, SiC, SiCN, MgF, $CaF_2$, NaF, $BaF_2$, $PbF_2$, LiF, $LaF_3$, and GaP.

4. The display device of claim 1, wherein the at least one metal layer includes at least one metal selected from a group consisting of Al, Ag, Mg, Cr, Ti, Ni, Au, Ta, Cu, Ca, Co, Fe, Mo, W, Pt, and Yb.

5. The display device of claim 1, wherein the thin film encapsulation layer includes at least one inorganic material layer.

6. The display device of claim 5, wherein the at least one inorganic material layer comprises at least one material selected from a group consisting of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride (SiON).

7. The display device of claim 5, wherein the thin film encapsulation layer further comprises at least one organic material layer.

8. The display device of claim 7, wherein the thin film encapsulation layer comprises a plurality of inorganic material layers and a plurality of organic material layers, wherein ones of the inorganic material layers and ones of the organic material layers are alternately stacked.

9. The display device of claim 7, wherein the at least one organic material layer include at least one material selected from a group consisting of epoxy resin, acryl resin, perylene resin and polyimide resin.

10. The display device of claim 1, further comprising an interference preventing layer arranged between the thin film encapsulation layer and the anti-reflection layer.

11. The display device of claim 10, wherein the interference preventing layer is comprised of a transparent material.

12. The display device of claim 10, wherein the interference preventing layer has a thickness in a range of 100 nm to 10 μm.

13. The display device of claim 1, further comprising a thin film transistor (TFT) to drive the OLED.

14. The display device of claim 13, wherein the TFT comprises an active layer comprised of a material selected from a group consisting of amorphous silicon, polycrystalline silicon and an oxide.

15. A method of manufacturing a display device, comprising:
  forming an organic light emitting diode (OLED) on a substrate;
  forming a thin film encapsulation layer on the substrate to cover the OLED; and
  forming an anti-reflection layer on the thin film encapsulation layer, the anti-reflection layer including at least one dielectric layer and at least one metal layer,
  wherein the at least one dielectric layer and the at least one metal layer are alternately stacked.

16. The method of claim 15, wherein the forming of the thin film encapsulation layer comprises forming at least one inorganic material layer.

17. The method of claim 16, wherein the at least one inorganic material layer comprises at least one material selected from a group consisting of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride (SiON).

18. The method of claim 15, wherein the forming of the thin film encapsulation layer comprises forming a plurality of inorganic material layers and a plurality of organic material layers, wherein ones of the inorganic material layers and ones of the organic material layers are alternately stacked on each other.

19. The method of claim 18, wherein each of the organic material layers include at least one material selected from a group consisting of epoxy resin, acryl resin, perylene resin and polyimide resin.

20. The method of claim 15, wherein the forming of the anti-reflection layer comprises forming at least two dielectric layers and at least two metal layers, wherein ones of the dielectric layers and ones of the metal layers are alternately stacked on each other.

21. The method of claim 20, wherein each of the dielectric layers include at least one material selected from a group consisting of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $VO_x$, $S1N_x$, $eN_x$, AlN, ZnS, CdS, SiC, SiCN, MgF, $CaF_2$, NaF, $BaF_2$, $PbF_2$, LiF, $LaF_3$, and GaP.

22. The method of claim 20, wherein each of the metal layers include at least one material selected from a group consisting of Al, Ag, Mg, Cr, Ti, Ni, Au, Ta, Cu, Ca, Co, Fe, Mo, W, Pt, and Yb.

23. The method of claim 15, further comprising an interference preventing layer interposed between the thin film encapsulation layer and the anti-reflection layer.

24. The method of claim 23, wherein the interference preventing layer is comprised of a transparent material.

* * * * *